(12) United States Patent
Kato

(10) Patent No.: US 8,086,926 B2
(45) Date of Patent: Dec. 27, 2011

(54) FAILURE DIAGNOSTIC APPARATUS, FAILURE DIAGNOSTIC SYSTEM, AND FAILURE DIAGNOSTIC METHOD

(75) Inventor: Takayuki Kato, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 155 days.

(21) Appl. No.: 12/051,412

(22) Filed: Mar. 19, 2008

(65) Prior Publication Data

US 2008/0244345 A1    Oct. 2, 2008

(30) Foreign Application Priority Data

Mar. 30, 2007    (JP) ................. 2007-093853

(51) Int. Cl.
*G01R 31/28* (2006.01)

(52) U.S. Cl. .......... 714/741; 714/732; 714/726

(58) Field of Classification Search ............ 714/724, 714/726, 727, 732, 741
See application file for complete search history.

(56) References Cited

U.S. PATENT DOCUMENTS

| | | | | |
|---|---|---|---|---|
| 4,688,223 A * | 8/1987 | Motika et al. | ............ | 714/728 |
| 4,817,093 A * | 3/1989 | Jacobs et al. | ............ | 714/728 |
| 5,353,289 A * | 10/1994 | Ohkawa | ............ | 714/33 |
| 5,475,694 A * | 12/1995 | Ivanov et al. | ............ | 714/732 |
| 5,515,384 A * | 5/1996 | Horton, III | ............ | 714/732 |
| 5,968,194 A * | 10/1999 | Wu et al. | ............ | 714/726 |
| 6,249,893 B1 * | 6/2001 | Rajsuman et al. | ............ | 714/741 |
| 6,553,527 B1 * | 4/2003 | Shephard, III | ............ | 714/733 |
| 6,971,054 B2 * | 11/2005 | Kurtulik et al. | ............ | 714/732 |
| 7,082,559 B2 * | 7/2006 | Nozuyama | ............ | 714/726 |
| 7,185,253 B2 * | 2/2007 | Mitra et al. | ............ | 714/734 |
| 7,412,637 B2 * | 8/2008 | Wang et al. | ............ | 714/729 |
| 7,509,551 B2 * | 3/2009 | Koenemann et al. | ............ | 714/732 |
| 7,552,373 B2 * | 6/2009 | Wang et al. | ............ | 714/729 |
| 7,558,999 B2 * | 7/2009 | Adkisson et al. | ............ | 714/737 |
| 7,729,884 B2 * | 6/2010 | Huang et al. | ............ | 702/185 |

OTHER PUBLICATIONS

Wu-Tung Cheng, et al., "Compactor Independent Direct Diagnosis" IEEE Computer Society, 2004, p. 204-209.

* cited by examiner

*Primary Examiner* — James C Kerveros
(74) *Attorney, Agent, or Firm* — Staas & Halsey LLP

(57) ABSTRACT

There is provided a failure diagnostic apparatus that diagnoses a semiconductor integrated circuit device for failure based on a compressed signal obtained by compressing a plurality of signals outputted from a plurality of scan chains in which a plurality of scan flip-flops, to which signals from the semiconductor integrated circuit device are inputted, are connected in series. For each stage of the scan chains, the failure diagnostic apparatus sets a virtual space compression circuit that compresses output signals of the scan flip-flops in the stage and a virtual pin connected to the output terminal of the virtual space compression circuit, and the output signal of the virtual pin is compared with the compression signal to diagnose the semiconductor integrated circuit device for failure.

18 Claims, 11 Drawing Sheets

SD(0)=0b xor 1b xor 2b
SD(1)=0a xor 1a xor 2a

FAILURE DIAGNOSTIC APPARATUS, FAILURE DIAGNOSTIC SYSTEM, AND FAILURE DIAGNOSTIC METHOD

CROSS-REFERENCE TO RELATED APPLICATIONS

This application is based upon and claims the benefit of priority from Japanese Patent Application No. 2007-093853 filed on Mar. 30, 2007, the entire contents of which are incorporated herein by reference.

BACKGROUND OF THE INVENTION

1. Field of the Invention

The application relates to failure diagnosis for estimating the location of failure that occurs in a semiconductor integrated circuit device.

2. Description of the Related Art

In recent years, as a manufacturing test of a semiconductor integrated circuit device, a BIST method has been used more frequently than a SCAN test method. Use of a BIST method makes failure diagnosis for estimating the location of failure more difficult than the case where a SCAN test method is used. In failure diagnosis of a semiconductor integrated circuit device using a BIST method, there are some case that the BIST method cannot be employed according to the state of operation of the circuit. Therefore, there is a need to estimate the location of failure independent of the state of operation of the circuit.

A method that meets the above need is described, for example, in "Computer Independent Direct Diagnosis", Wu-Tung Cheng et al., IEEE Computer Society, 2004, pp. 204-209.

SUMMARY

According to an aspect of the present invention, there is provided a failure diagnostic apparatus that diagnoses a semiconductor integrated circuit device for failure based on a compressed signal obtained by compressing a plurality of signals outputted from a plurality of scan chains in which a plurality of scan flip-flops, to which signals from the semiconductor integrated circuit device are inputted, are connected in series. For each stage of the scan chains, the failure diagnostic apparatus sets a virtual space compression circuit that compresses output signals of the scan flip-flops in the stage and a virtual pin connected to the output terminal of the virtual space compression circuit, and the output signal of the virtual pin is compared with the compression signal to diagnose the semiconductor integrated circuit device for failure.

The above-described embodiments of the present invention are intended as examples, and all embodiments of the present invention are not limited to including the features described above.

DESCRIPTION OF THE PREFERRED EMBODIMENTS

Figure 1A:
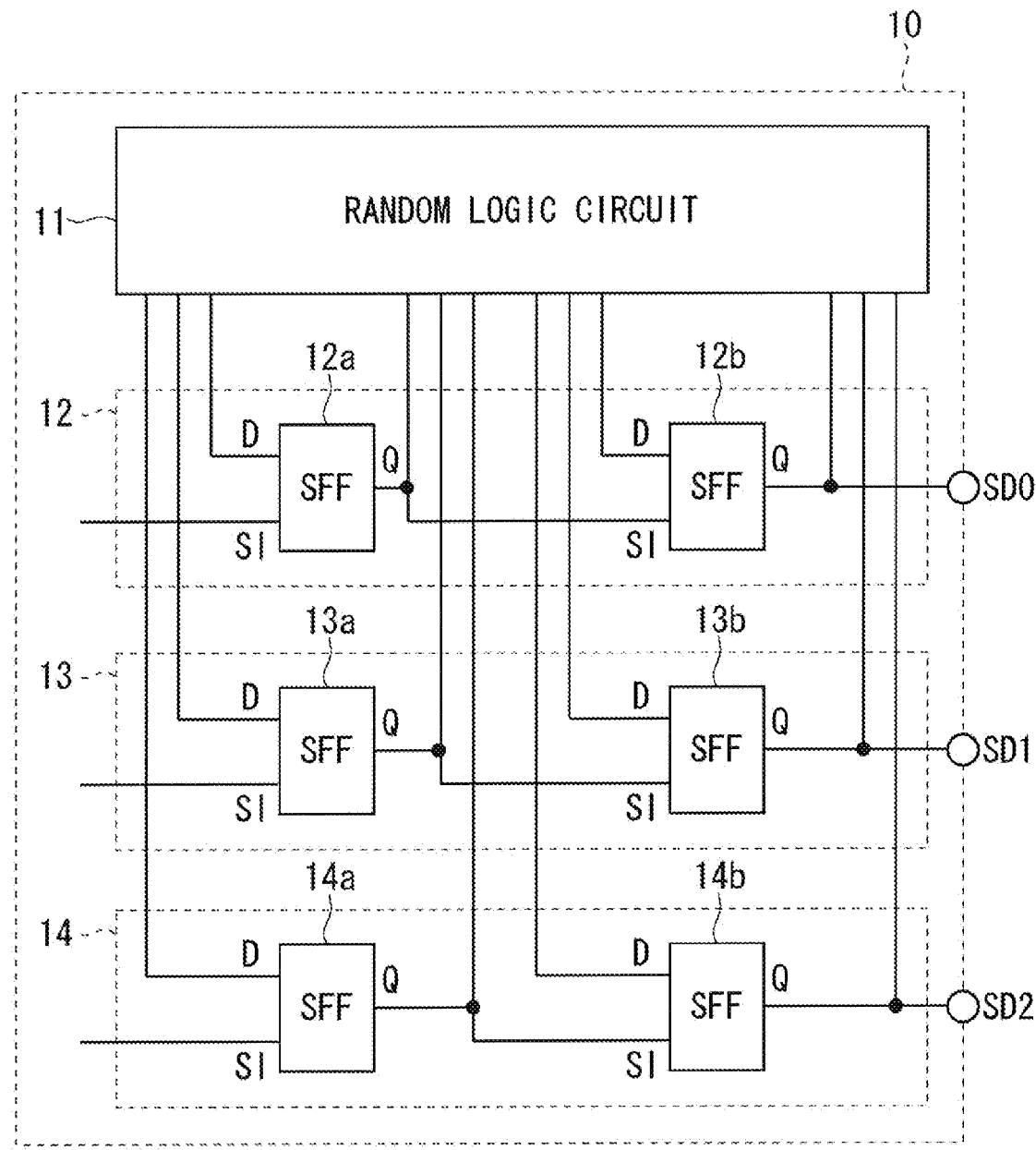
FIG. 1A shows a semiconductor integrated circuit device according to an embodiment of the invention.

Reference may now be made in detail to embodiments of the present invention, examples of which are illustrated in the accompanying drawings, wherein like reference numerals refer to like elements throughout.

FIG. 1A shows a semiconductor integrated circuit device. The semiconductor integrated circuit device 10 employs a SCAN test method as a manufacturing test of a random logic circuit. As shown in FIG. 1A, a random logic circuit 11 of the semiconductor integrated circuit device 10 is coupled to input terminals D of scan-type flip-flop circuits (hereinafter referred to as SFFs) 12a, 12b, 13a, 13b, 14a and 14b that form scan chains 12, 13 and 14. Signals are inputted to scan-in terminals SI of the SFFs 12a, 13a and 14a. Output terminals Q of the SFFs 12a, 13a and 14a are coupled to the scan-in terminals SI of the SFFs 12b, 13b and 14b in the next stage. The output terminals Q of the SFFs 12b, 13b and 14b are coupled to test output terminals SD0 to SD2, respectively.

In the SCAN test method, output signals of the random logic circuit 11 are held in the SFFs 12a to 14b. The signals held in the SFFs 12a to 14b are sequentially outputted based on a clock signal. That is, in the scan chain 12 including the SFFs 12a and 12b, the signals held in the SFF 12b and the SFF 12a are sequentially outputted to the test output terminal SD0. Let t be the cycle in which such a signal is outputted. The signal SD0(t) (t=0, 1) at the output terminal SD0 is expressed as follows:

$$SD0(0)=0b, SD0(1)=0a$$

where 0a and 0b are the signals held in the SFFs 12a and 12b, respectively.

Similarly, the signals 1a and 1b held in the SFFs 13a and 13b are outputted in the following expressions:

$$SD1(0)=1b, SD1(1)=1a$$

The signals 2a and 2b held in the SFFs 14a and 14b are outputted in the following expressions:

$$SD2(0)=2b, SD2(1)=2a$$

Figure 1B:
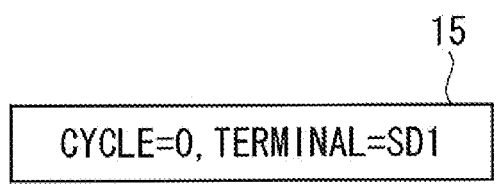
FIG. 1B shows a test result according to an embodiment of the invention.

The output signals are compared with expectation values in a test apparatus. When the comparison shows that a disparity occurs (also referred to as failed), in general, the terminal and the cycle in which the disparity has occurred are stored in the test apparatus and outputted as a failure log. For example, when a disparity occurs at the SD1 in the cycle 0, a failure log 15 shown in FIG. 1B is outputted.

Failure diagnosis (estimation of the location of failure) is carried out to investigate causes of failure of a semiconductor integrated circuit device showing a disparity, that is, a failed semiconductor integrated circuit device.

The first operation of failure diagnosis is identifying the SFF that has captured failure. The SFF that has captured failure is the SFF that has captured an output signal showing a disparity from the random logic.

In the second operation, a failure diagnostic apparatus (computer) assumes the state of the failure on the net data of the random logic circuit 11, and carries out failure simulation. If the SFF to which the failure has been transmitted in the result of the failure simulation coincides with the SFF identified in the first operation, the assumed failure can be judged to be true (the actual failure in the failed semiconductor integrated circuit device coincides with the assumed failure).

In the SCAN test method, the signal observed at a test output terminal in a cycle has a one-to-one relationship with the signal captured at each SFF. Therefore, the failure diagnostic apparatus can use the failure point (terminal and cycle) recorded in the failure log to easily identify the SFF that has captured the failure. For example, when the value of SD1(0) (=1b) is failed, that is, does not coincide with its expectation value, the SFF 13b that has captured the signal 1b can be identified. That is, the failure diagnosis described above can be applied to the SCAN test.

However, the SCAN test method has a problem of increased test time when the total number of SFFs in a semiconductor integrated circuit device and hence the number of SFFs per scan chain increases. To reduce the test time, it is effective to increase the number of scan chains. However, because of constraints of test apparatus and circuit design, it is difficult to reduce the number of SFFs per scan chain and hence the test time by increasing the number of test output terminals.

Figures 2A, 2B:
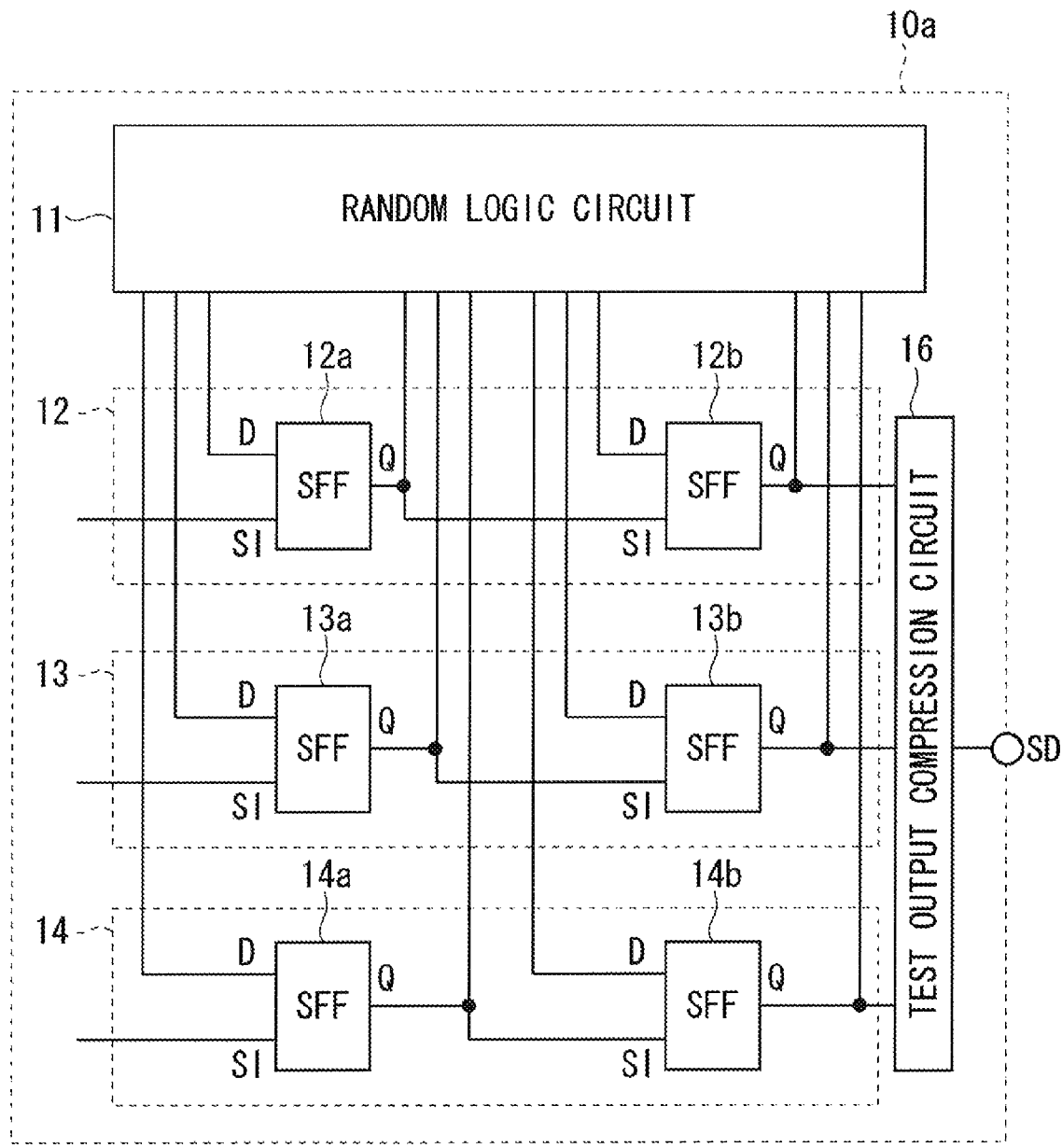
FIG. 2A shows a semiconductor integrated circuit device according to an embodiment of the invention.
FIG. 2B shows a compression result according to an embodiment of the invention.

Therefore, a BIST (Built-in Self Test) circuit is provided in a semiconductor integrated circuit device. As shown in FIG. 2A, a semiconductor integrated circuit device 10a includes a test output compression circuit 16 as a space compression circuit. The test output compression circuit 16 is coupled to test output terminals SD. The test output compression circuit 16 compresses a plurality of input scan chain signals into a fewer number of signals than a number of the plurality of input scan chain signals. In FIG. 2A, the test output compression circuit 16 compresses the three 1-bit signals of the three scan chains into a one-bit signal. Such a test output compression circuit can increase the number of scan chains in the semiconductor integrated circuit device without increasing the number of test output terminals. That is, such a test output compression circuit can reduce the number of SFFs per scan chain and shorten the test time.

The test output compression circuit 16 is, for example, an exclusive OR circuit (XOR circuit). The test output compression circuit 16 compresses output signals of the SFFs 12a, 13a and 14a or SFFs 12b, 13b and 14b into a one-bit output signal. FIG. 2B shows the relationship between the signal observed at a test output terminal and the signal captured at each SFF.

$SD(0) = 0b$ xor $1b$ xor $2b$ $SD(1) = 0a$ xor $1a$ xor $2a$

However, in this method, since the signals captured at the SFFs in each stage (12b, 13b and 14b, for example) are compressed into a one-bit signal, the SFF where a disparity occurs cannot be identified from the result of recording a failure log. For example, when SD(0) shows a disparity, any one of the SFFs 12b, 13b and 14b may show a disparity, or all the SFFs may show disparities.

Figure 3:
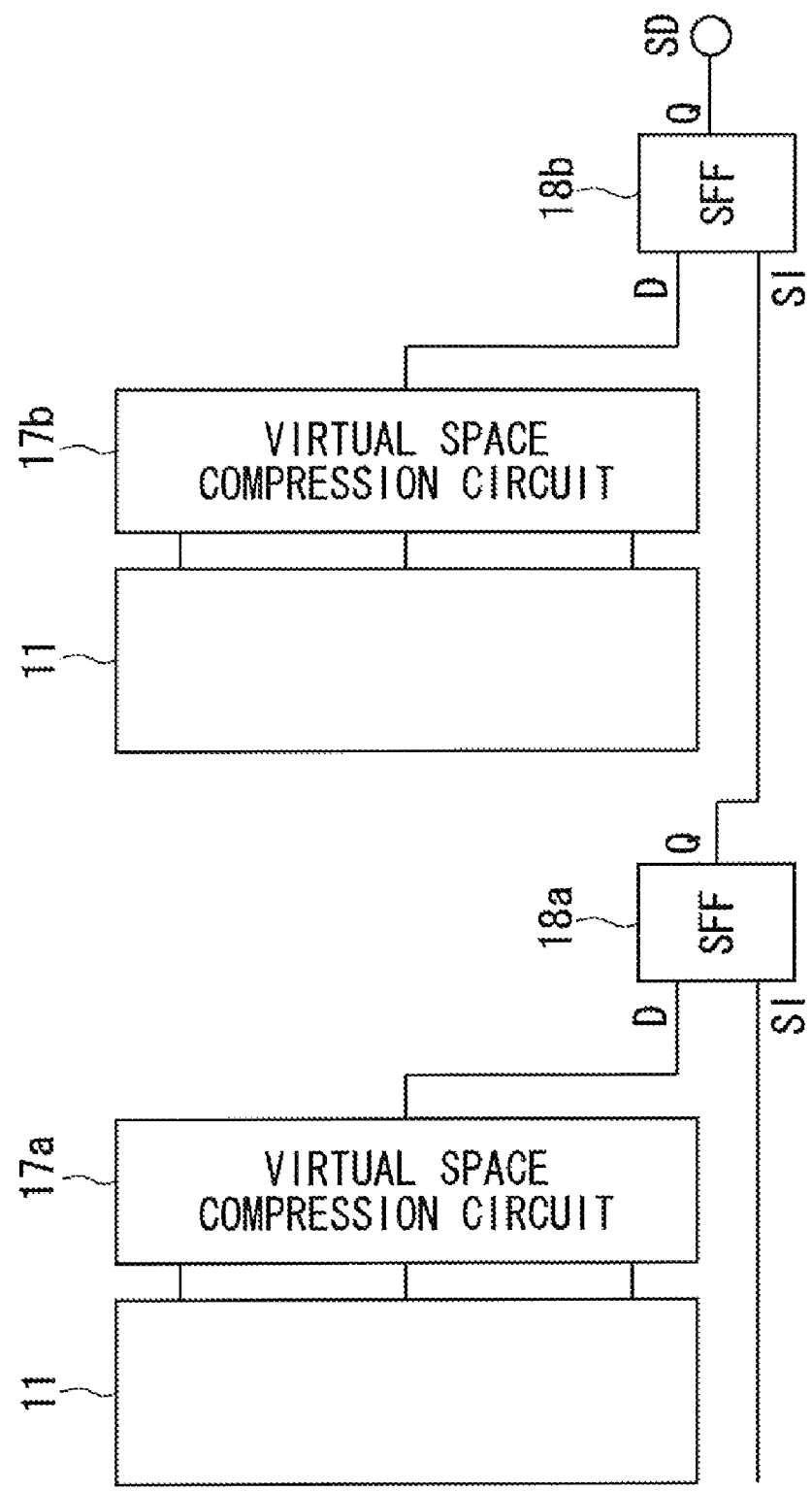
FIG. 3 shows a semiconductor integrated circuit device according to an embodiment of the invention.

FIG. 3 shows a semiconductor integrated circuit device. For the semiconductor integrated circuit device shown in FIG. 3, virtual circuit data in which virtual space compression circuits 17a and 17b and virtual SFFs 18a and 18b are set for respective stages of a scan chain are generated in a failure diagnostic apparatus. A virtual space compression circuit and a virtual SFF are also generated for each test output terminal not shown. Each of the virtual space compression circuits 17a and 17b has the same configuration as that of the test output compression circuit 16 shown in FIG. 2A. The signal observed at the test output terminal SD in the virtual circuit data is the same as that observed in the actual circuit, so that the failure diagnostic method described above can be applied to the virtual circuit data.

Figure 4:
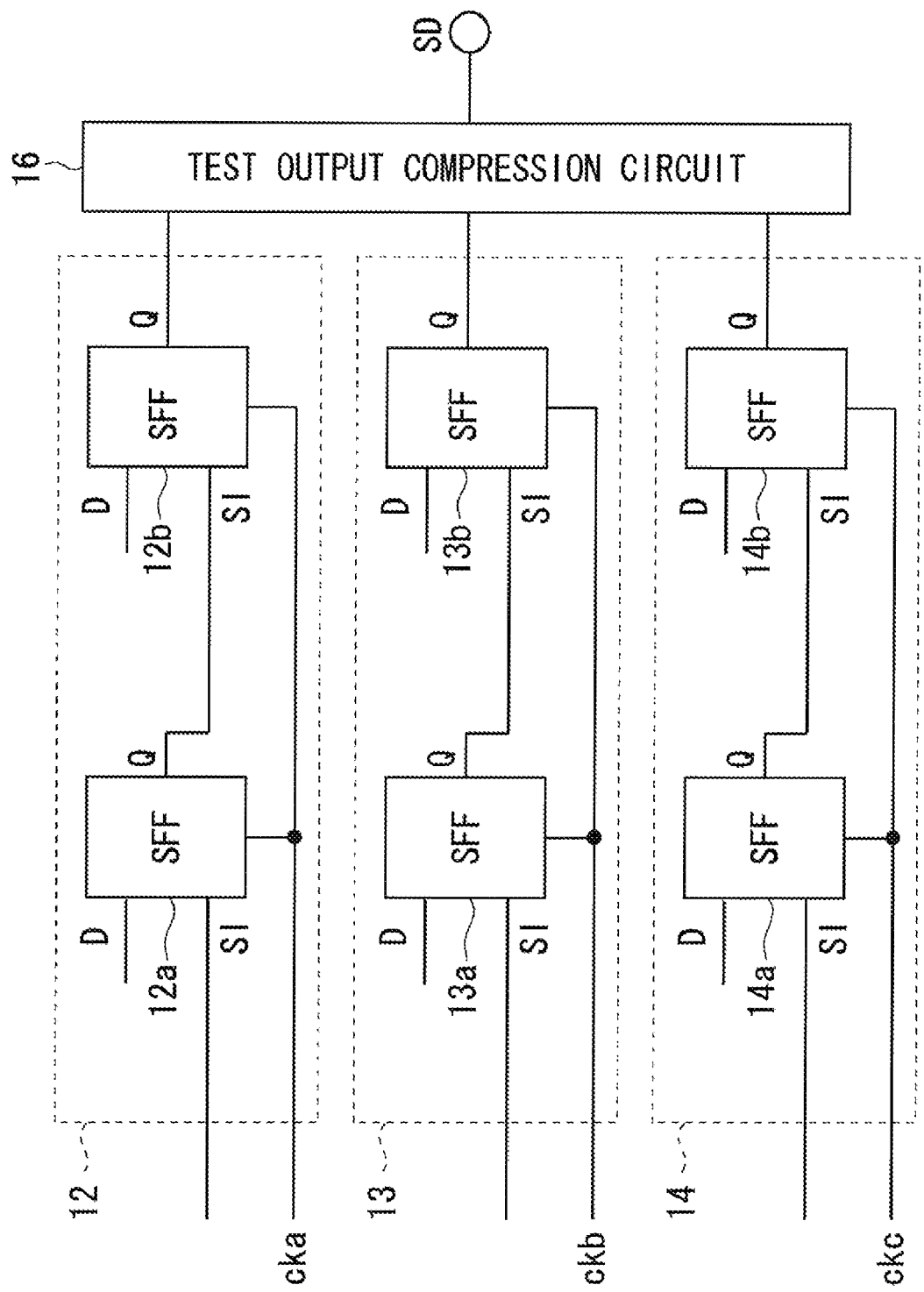
FIG. 4 shows a disabled state according to an embodiment of the invention.

However, in the method for the semiconductor integrated circuit device shown in FIG. 3, each of the one-bit virtual SFFs 18a and 18b represents the operations of the pins other than the input terminals D of SFFs as single operation of SFF by compressing. There is therefore a constraint that all signals other than those inputted to the input terminals D, such as clock signals, presets, and clear signals (none of them are illustrated), for a plurality of SFFs grouped as a virtual SFF, change in the same manner. Thus, the method described above may not accommodate all possible states of operation. An example of such situations is a case that the clock signal cka for SFFs 12a and 12b and the clock signal ckc for SFFs 14a and 14b are active, and the clock signal ckb for SFFs 13a and 13b is inactive as shown in FIG. 4. The SFFs 13a and 13b do not capture signals from a random logic circuit and output the signals originally held in the SFFs 13a and 13b. Therefore, the output signal SD(1) has a signal value obtained by compressing the signals that the SFFs 12a and 14a have captured from the random logic circuit and the signal that the SFF 13a has originally held (which is not a captured output signal from the random logic circuit). The output signal SD(1) has a signal value obtained by compressing the signals that the SFFs 12a, 13a and 14a have captured from the random logic circuit in on the virtual circuit data, and hence may differ from actual operation.

Figure 5:
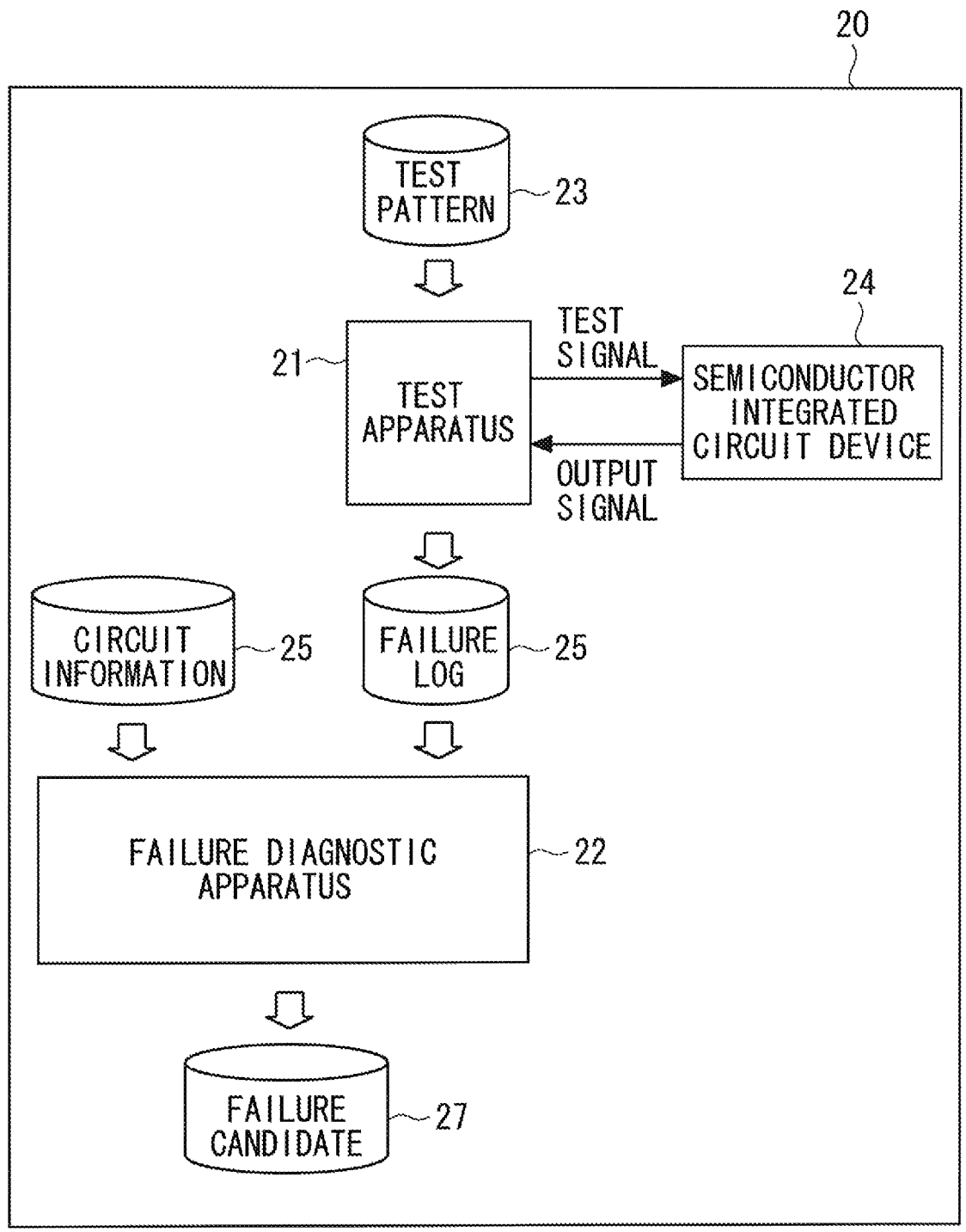
FIG. 5 shows an embodiment of the invention.

FIG. 5 shows an embodiment.

As shown in FIG. 5, a test system 20 includes a test apparatus 21 as a data generation unit, an observation unit, an execution unit and a judgment unit, and a failure diagnostic apparatus 22. The test apparatus 21 judges whether or not a semiconductor integrated circuit device (hereinafter referred to as LSI) 24 as a test target is good based on an input test pattern 23. The test pattern 23 includes a pattern of test signals for operating the LSI 24 for each cycle number in a shipping test, and expectation values representing signals that are expected to be outputted from the LSI 24 for that pattern. The test apparatus 21 not only operates the LSI 24 in the test mode but also supplies the test signals to the LSI 24. The test apparatus 21 compares the output signal, which is the test result outputted from the LSI 24, with its expectation value to judge whether or not the LSI 24 is good. The test apparatus 21 judges that the LSI 24 is defective when the output signal does not coincide with the expectation value, and generates a failure log 25 containing information on the cycle for the output signal of the judgment and the terminal where the output signal does not coincide with the expectation value.

The failure diagnostic apparatus 22 has a storage device (not illustrated). The storage device stores circuit information (net list) 26 of the LSI 24 as the test target. The failure diagnostic apparatus 22 constructs virtual circuit data of the LSI 24 based on the circuit information 26, assumes failure in the virtual circuit data, and performs failure simulation. The failure diagnostic apparatus 22 judges that the assumed failure (location, failure mode) is correct (true) when the simulation result coincides with the values in the failure log 25, while judging the assumed failure is incorrect (false) when the simulation result does not coincide with the values in the failure log 25. The failure diagnostic apparatus 22 then generates failure candidates 27 including the failure that has been judged to be true. According to this configuration, it is easily possible to judge whether the assumed failure is true or false. It is noted that a plurality of failures may be judged to be true depending on the failure of the LSI 24 and contained in the failure candidates 27.

In a detailed description, the failure diagnostic apparatus 22 sets a virtual circuit equivalent to the LSI 24, specifically, a logic circuit 31, scan chains 34 to 36, and a test output compression circuit 37, based on the net list. The virtual circuit includes a virtual pin set in such a way that a virtual output signal equivalent to the output signal outputted from the LSI 24 is obtained. The test apparatus 21 stores the test result of the LSI 24 as a failure log. The failure diagnostic apparatus 22 then executes failure simulation on the virtual circuit, acquires the simulation result at the set virtual pin, and compares the value of the simulation result with the information in the failure log. The failure diagnostic apparatus 22 judges that the assumed failure (location, failure mode) is correct (true) when the simulation result coincides with the values in the failure log, while judging that the assumed failure is incorrect (false) when the simulation result does not coincide with the values in the failure log.

Figure 6:
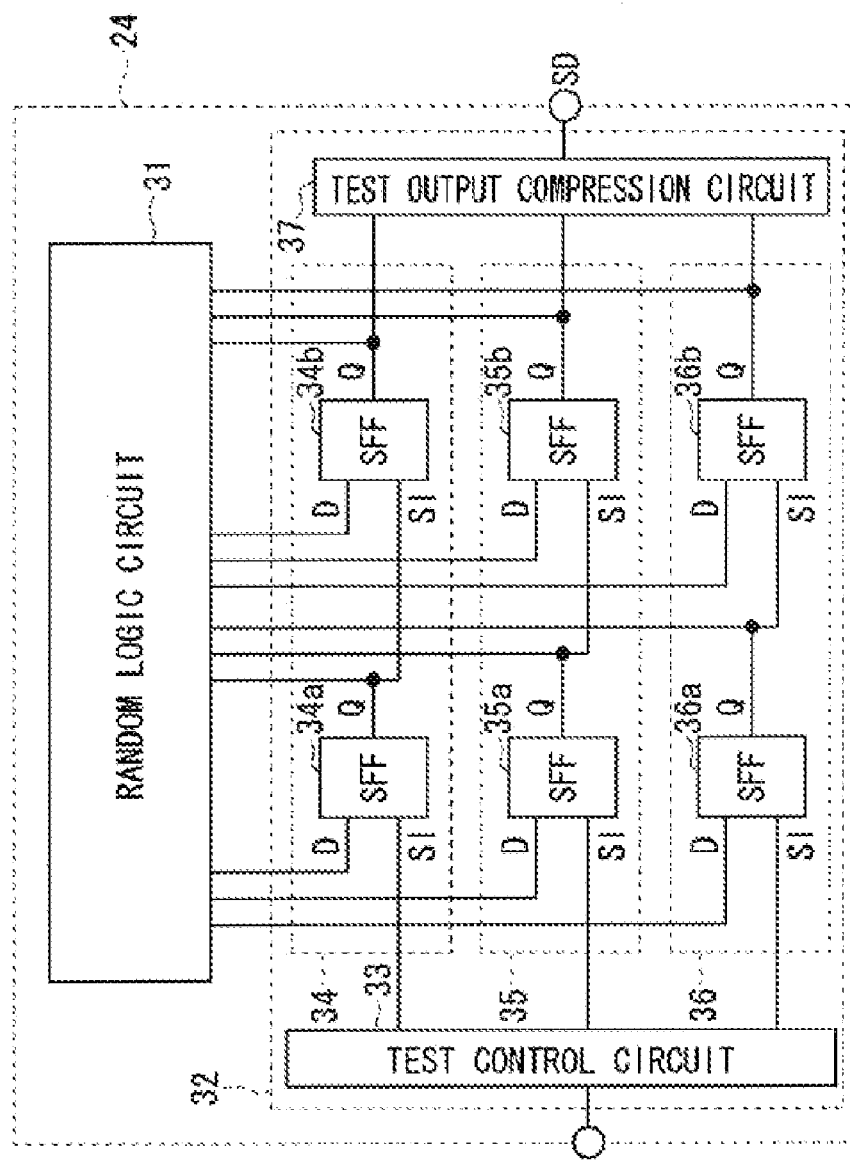
FIG. 6 shows a semiconductor integrated circuit device according to an embodiment of the invention.

FIG. 6 shows a semiconductor integrated circuit device (LSI).

As shown in FIG. 6, an LSI 24 includes a random logic circuit 31 and a BIST (Built-in Self Test) circuit 32 for carrying out the manufacturing test of the logic circuit 31. In this embodiment, the BIST circuit includes a test control circuit 33, a plurality of (three in FIG. 6) scan chains 34 to 36, and a test output compression circuit 37 as a space compression circuit. When test signals are inputted from the test apparatus 21, the test control circuit 33 operates the scan chains 34 to 36 and the test output compression circuit 37, supplies the test pattern to the logic circuit 31 via the scan chains 34 to 36 to operate the random logic circuit 31. The random logic circuit 31 operates according to the supplied test pattern and outputs resultant output signals to the scan chains 34 to 36. The scan chains 34 to 36 transmit the output signals of the random logic circuit 31 to the test output compression circuit 37. The test output compression circuit 37 is, for example, an exclusive OR circuit (XOR circuit), compresses the plurality of output signals outputted from the random logic circuit 31 into, for example, a one-bit output signal, and outputs the compressed signal.

The scan chain 34 includes scan flip-flops (SFFs) 34a and 34b that are connected in series and form two stages. Similarly, the scan chain 35 includes SFFs 35a and 35b, and the scan chain 36 includes SFFs 36a and 36b.

The random logic circuit 31 receives input signals from output terminals Q of the scan flip-flops (SFFs) 34a to 36b that form the scan chains 34 to 36. Output signals of the random logic circuit 31 are inputted to input terminals D of the SFFs 34a to 36b. In each of the scan chains 34 to 36, scan-in terminals SI of the SFFs 34a, 35a and 36a in the same stage (first stage) receive output signals of the test control circuit 33. The output terminals Q of the SFFs 34a to 36a in the same stage are coupled to the scan-in terminals SI of the SFFs 34b to 36b in the next stage (final stage). The output terminals Q of the SFFs 34b to 36b that form this stage are coupled to the test output compression circuit 37.

Although not illustrated, clock signals corresponding to the scan chains 34 to 36 (see FIG. 4) are supplied to the SFFs 34a to 36b. The SFFs 34a to 36b capture the output signals of the random logic circuit 31. The scan chains 34 to 36 operate as so-called shift registers in which the signals held in the SFFs are transmitted in response to the respective clock signals. For example, the SFF 34b, which is a component of the scan chain 34, sequentially outputs the signals held in the SFF 34b and the SFF 34a.

As described above, the test output compression circuit 37 is an exclusive OR circuit (XOR circuit). The test output compression circuit 37 compresses the plurality of output signals outputted from the SFFs 34b to 36b in the final stage into a one-bit output signal and outputs the compressed signal via a test output terminal SD. The test apparatus 21 shown in FIG. 5 compares the signals sequentially outputted from the test output terminal SD with expectation values, and, when they differ from each other (failed), stores information on the cycle and the terminal (such as the terminal number) as the failure log 25.

The failure diagnostic apparatus 22 shown in FIG. 5 generates virtual circuit data based on the circuit information (net list) 26 of the LSI 24. Specifically, the failure diagnostic apparatus 22 sets a virtual space compression circuit and a virtual external pin for each stage of the scan chains 34 to 36. The virtual space compression circuit has the same configuration as that of the space compression circuit (test output compression circuit 37).

Figure 7:
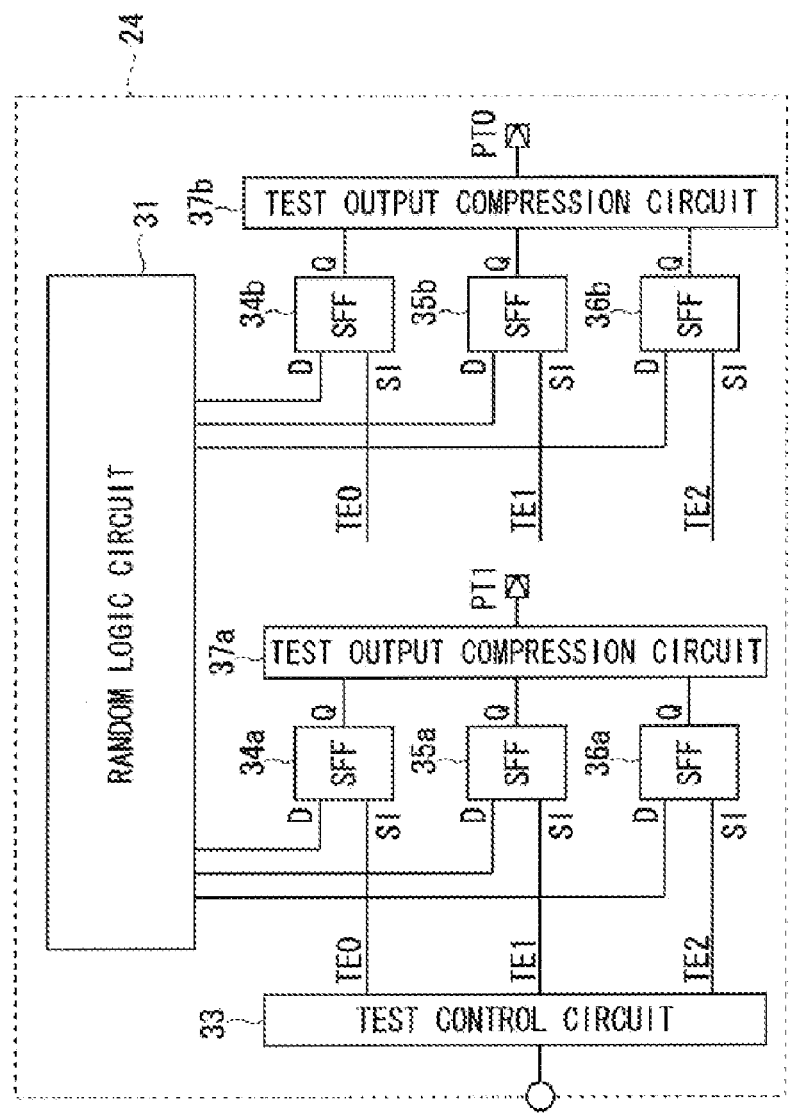
FIG. 7 shows a semiconductor integrated circuit device in which virtual pins are set according to an embodiment of the invention.

For the LSI 24 shown in FIG. 6, the SFFs 34a to 36a form the same stage and the SFFs 34b to 36b form the same stage. As shown in FIG. 7, the failure diagnostic apparatus 22 generates a test output compression circuit 37a as the virtual space compression circuit to which the output terminals of the SFFs 34a to 36a that form the same stage are connected and a virtual pin PT1 connected to the circuit 37a.

The failure diagnostic apparatus 22 further generates a test output compression circuit 37b as the virtual space compression circuit to which the output terminals of the SFFs 34b to 36b that form the same stage are connected and a virtual pin PT0 connected to the circuit 37b. That is, the failure diagnostic apparatus 22 generates virtual circuit data for each stage of the scan chains 34 to 36 in such a way that the output signals of the SFFs are compressed and outputted to the virtual pin.

The output signals of the virtual pins PT0 and PT1 have a one-to-one relationship with the signals outputted in a time series from the test output terminal SD of the LSI 24. Specifically, the output signal of the virtual pin PT0 corresponds to the signal outputted from the test output terminal SD of the LSI 24 in the cycle 0. The output signal of the virtual pin PT1 corresponds to the signal outputted from the test output terminal SD of the LSI 24 in the cycle 1.

Then, based on the contents of the failure log 25, the failure diagnostic apparatus 22 assigns the failure log to the corresponding virtual pin. The signals captured at the SFFs 34a to 36a and 34b to 36b in the respective stages are compressed and outputted from the test output terminal SD. The signals outputted in a time series correspond to the stage numbers of the scan chains 34 to 36. For example, the failure log first observed (cycle 0) at the test output terminal SD corresponds to the final stage of the scan chains 34 to 36. Therefore, the failure diagnostic apparatus 22 assigns the first observed failure log to the virtual pin PT0 to which the final stage is connected.

Then, the failure diagnostic apparatus 22 assumes failure in the random logic circuit 31 in the generated virtual circuit data and carries out failure simulation. The result of the failure simulation is obtained in the form of whether or not the failure is transmitted to one of the set virtual pins, that is, whether or not a signal at a level according to the failure is outputted.

The output signals at the virtual pins in the failure simulation correspond to the signals that the test output compression circuit 37a and 37b compresses the signals held in the SFFs that form each stage of the scan chains 34 to 36. The signal held in each SFF is determined by the signal to the input terminal of the SFF. For example, when the clock signal is active, the signal value at the input terminal D is captured. When the clock signal is inactive, the signal value already held remains. Therefore, for example, even when the clock is inactive at one SFF in a certain stage, the output signal observed at each of the virtual pins reflects the state of the clock signal at each SFF.

When the clock signal supplied to the SFF 35a shown in FIG. 7 is inactive and the clock signals supplied to the SFFs 34a and 36a are active, the SFF 35a does not capture the signal inputted to the input terminal D but holds the state of the current signal, and the SFFs 34a and 36a capture the signals inputted to the input terminals D. The output signal of the virtual pin PT1 corresponds to the value obtained by compressing the signal values of the SFFs 34a to 36a connected to the test output compression circuit 37a to which the virtual pin PT1 is connected, that is, the value obtained by compressing the signal values that the SFFs 34a and 36a have captured from the random logic circuit 31 and the signal value that the SFF 35a has originally held. Therefore, even in the case described above, the signal level at the test output terminal SD in the actual circuit will not differ from the signal levels at the virtual pins PT1 and PT1 in the virtual circuit data.

Then, the failure diagnostic apparatus 22 checks whether the virtual pin to which the failure is transmitted in the failure simulation coincides with the virtual pin to which the failure log 25 is assigned. When these virtual pins coincide with each other, the failure diagnostic apparatus 22 judges that the assumed failure is true. On the other hand, when these virtual pins do not coincide with each other, the failure diagnostic apparatus 22 judges that the assumed failure is false. When the failure diagnostic apparatus 22 has judged the assumed failure to be false, the failure diagnostic apparatus 22 assumes other failure mode or failure location and then carries out failure simulation for judgment described above.

This embodiment provides the following advantages:

(1) Based on the circuit information 26 of the LSI 24, the failure diagnostic apparatus 22 generates the virtual circuit data that sets, for the stages of the scan chains 34 to 36, the test output compression circuits 37a and 37b that compress the output signals of the scan flip-flops 34a to 36a and 34b to 36b in the respective stages as well as the virtual pins PT1 and PT0 connected to the output terminals of the compression circuits 37a and 37b. Then, the failure diagnostic apparatus 22 has the LSI 24 carry out a test and observes the signal at the test output terminal SD. The failure diagnostic apparatus 22 carries out failure simulation on the virtual circuit data to check whether or not the assumed failure has been transmitted to the virtual pins PT1 and PT, and then compares the failure log 25 at the test output terminal SD with the result of whether or not the failure has been transmitted to the virtual pins PT1 and PT0 to judge whether or not the LSI 24 has failed.

The signal at each of the virtual pins PT1 and PT0 corresponds to the signal observed at the test output terminal SD independent of the operation of the scan chains 34 to 36. That is, the signal at each of the virtual pins corresponds to the signal observed at the test output terminal described above. Failure diagnosis can therefore be carried out in a failure diagnostic method similar to the SCAN test method. Furthermore, since the scan flip-flops are independent of each other, failure diagnosis of the semiconductor integrated circuit device (LSI 24) can be carried out without operation condition constraints.

Although the LSI 24 with three scan chains 34 to 36 is diagnosed for failure in this embodiment, an LSI with two, four or more scan chains may be diagnosed for failure.

Although the scan chains 34 to 36 in this embodiment include two scan flip-flops 34a and 34b, 35a and 35b, and 36a and 36b, respectively, an LSI using scan chains including three (three stages) or more scan flip-flops may be diagnosed for failure.

Although the LSI 24 with one test output terminal SD has been diagnosed for failure in this embodiment, an LSI with a plurality of test output terminals may be diagnosed for failure. For example, as shown in FIG. 8, an LSI 40 includes a random logic circuit 41, four scan chains 42 to 45 connected to the circuit 41, a test output compression circuit 46 as the space compression circuit that compresses the output signals of the scan chains 42 and 43, and a test output compression circuit 47 as the space compression circuit that compresses the output signals of the scan chains 44 and 45.

Figure 9:
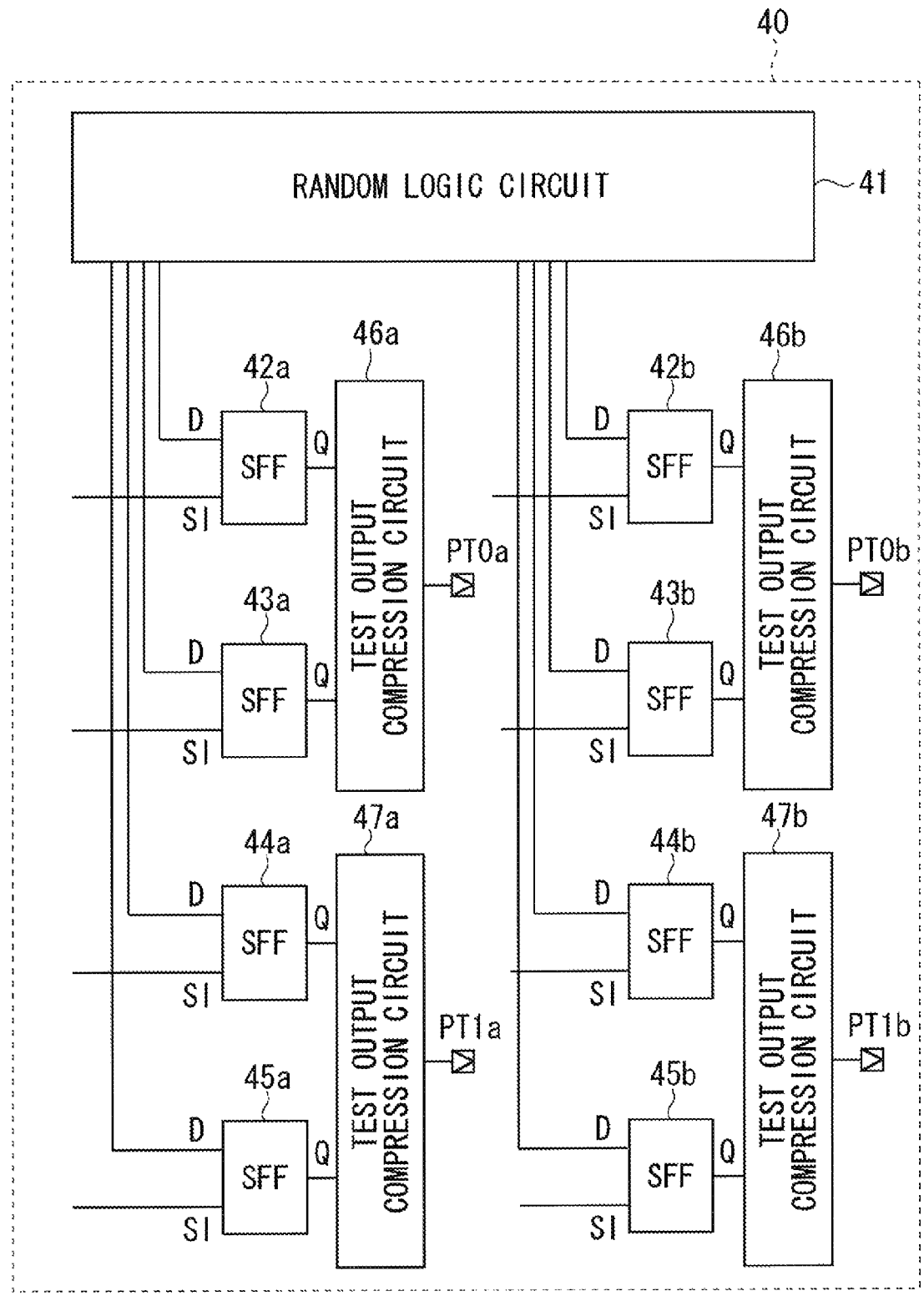
FIG. 9 shows a semiconductor integrated circuit device in which virtual pins are set according to an embodiment of the invention.

The output terminals of the test output compression circuits 46 and 47 are connected to two test output terminals SD0 and SD1, respectively. The failure diagnostic apparatus 22 generates virtual circuit data shown in FIG. 9 based on the circuit information of the LSI 40. The virtual circuit data includes a test output compression circuit 46a as the virtual space compression circuit to which SFFs 42a and 43a, which form the first stage of the scan chains 42 and 43, are connected, and a test output compression circuit 47a as the virtual space compression circuit to which SFFs 44a and 45a, which form the first stage of the scan chains 44 and 45, are connected.

Furthermore, the virtual circuit data includes a test output compression circuit 46b as the virtual space compression circuit to which SFFs 42b and 43b, which form the final stage of the scan chains 42 and 43, are connected, and a test output compression circuit 47b as the virtual space compression circuit to which SFFs 44b and 45b, which form the final stage of the scan chains 44 and 45, are connected. That is, in the LSI 40 shown in FIG. 8, a virtual pin and a test output compression circuit are set for each of the test output terminals and each stage of the scan chains.

Figure 8:
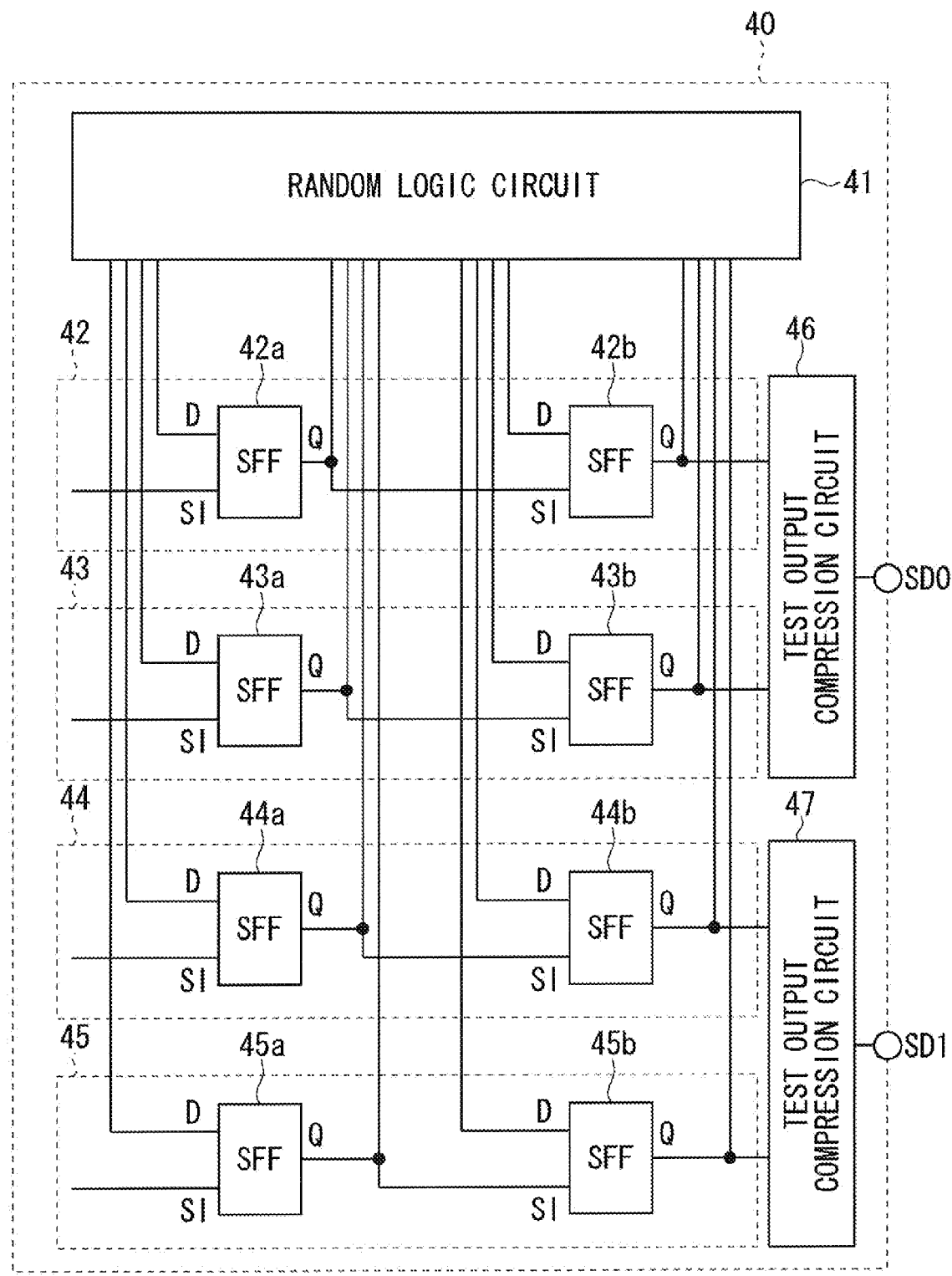
FIG. 8 shows a semiconductor integrated circuit device according to an embodiment of the invention.
Figure 10:
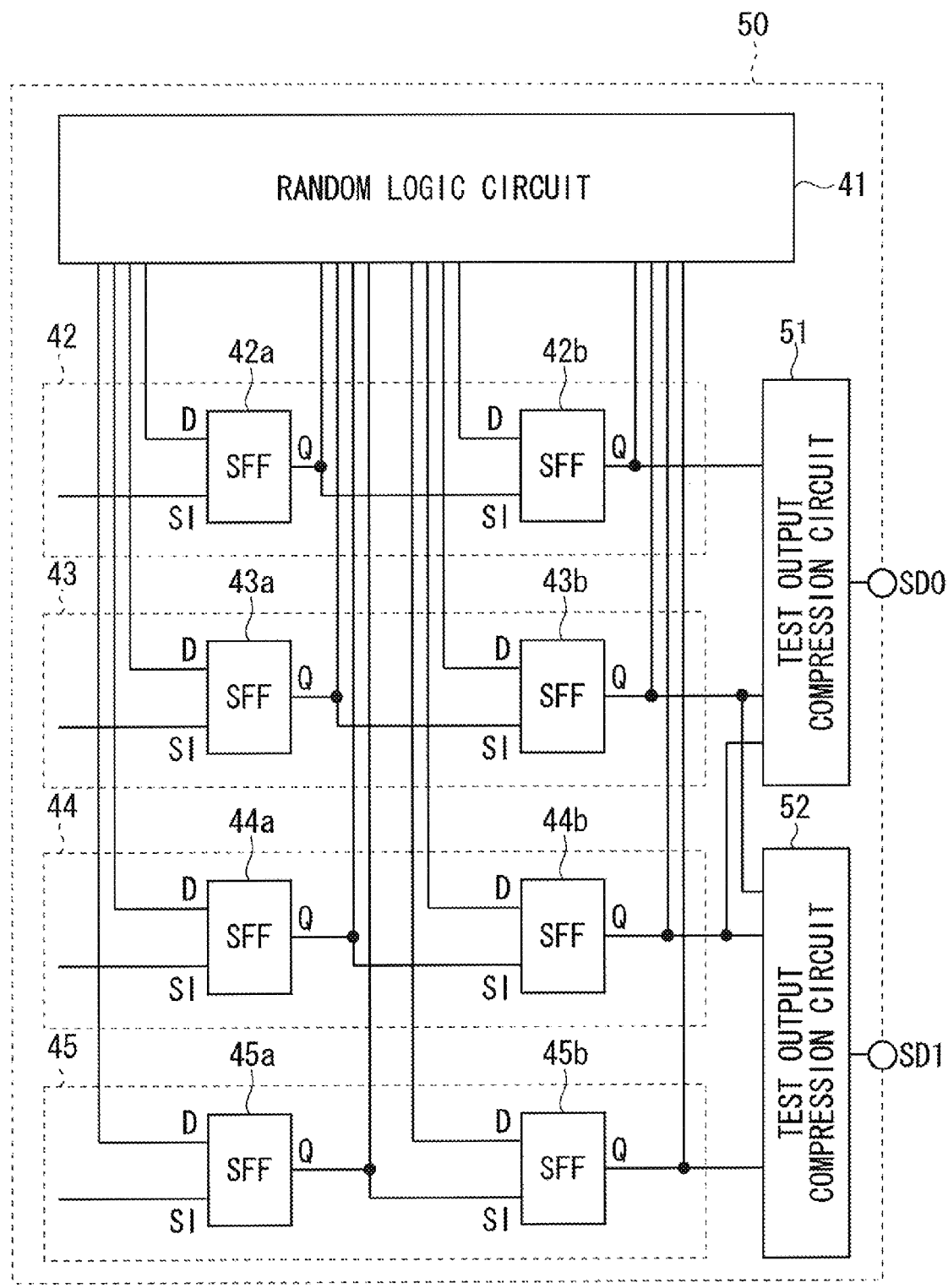
FIG. 10 shows a semiconductor integrated circuit device according to an embodiment of the invention.

In the semiconductor integrated circuit device shown in FIG. 8, the output signals of the scan chains 42 and 43 are compressed and outputted to one test output terminal SD0. The output signals of the scan chains 44 and 45 are compressed and outputted to one test output terminal SD1. These output signals may be outputted to a plurality of test output terminals. For example, in an LSI 50 shown in FIG. 10, output signals of the scan chains 42, 43 and 44 are inputted to a test output compression circuit 51 as the space compression circuit. Output signals of the scan chains 43, 44 and 45 are inputted to a test output compression circuit 52 as the space compression circuit. Therefore, in the LSI 50, the output signals of the scan chains 43 and 44 are compressed along with the output signals of the other scan chains and outputted to the two test output terminals SD0 and SD1, respectively.

Figure 11:
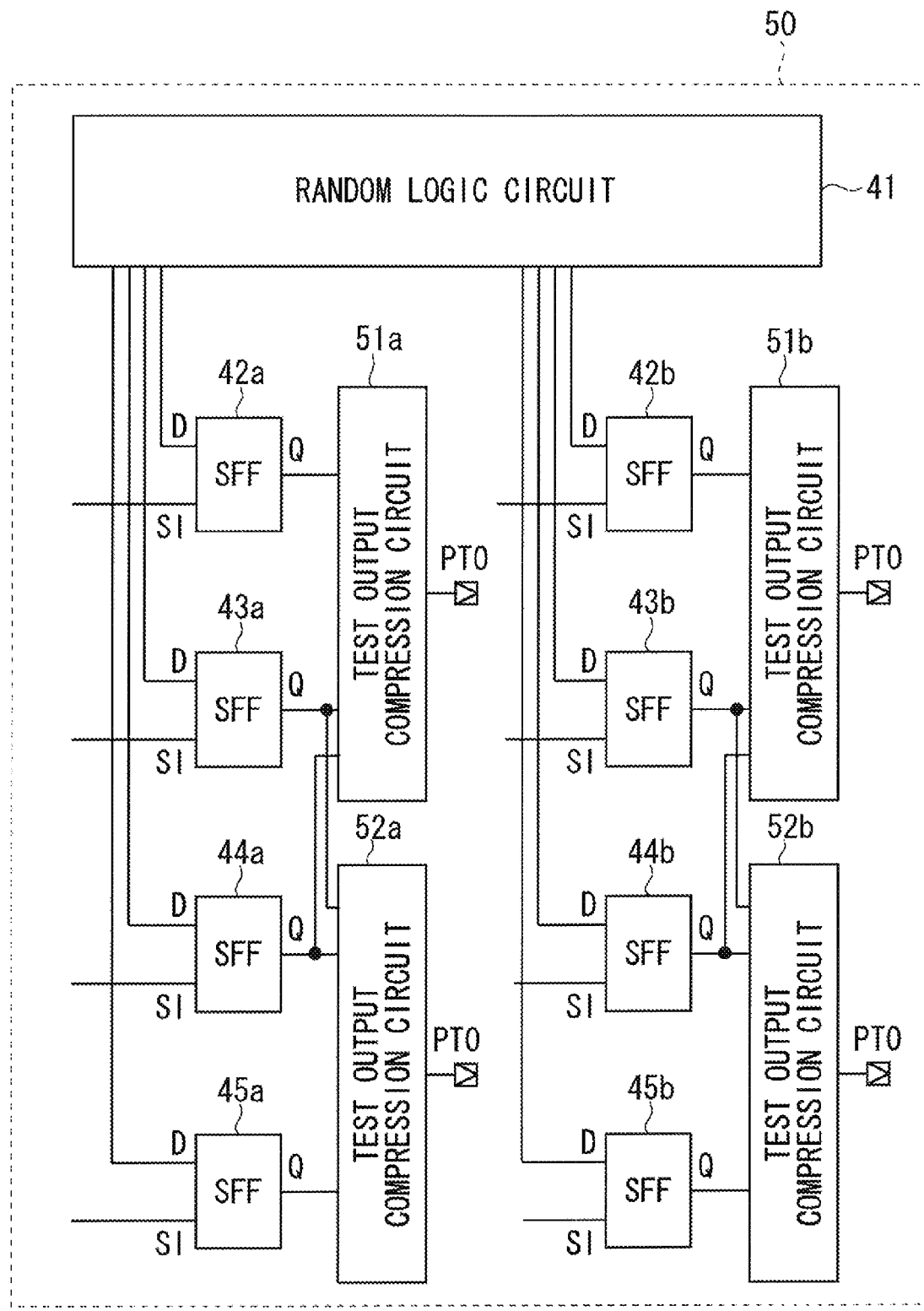
FIG. 11 shows a semiconductor integrated circuit device in which virtual pins are set according to an embodiment of the invention.

In the case of the LSI 50, the connection of test output compression circuits in virtual circuit data is the same as the connection in the actual LSI 50. That is, as shown in FIG. 11, SFFs 42a, 43a and 44a, which form the first stage of the scan chains 42 to 44, are connected to a test output compression circuit 51a as the virtual space compression circuit. SFFs 43a, 44a and 45a, which form the first stage of the scan chains 43 to 45, are connected to a test output compression circuit 52a as the virtual space compression circuit. Similarly, SFFs 42b, 43b and 44b, which form the final stage of the scan chains 42 to 44, are connected to a test output compression circuit 51b as the virtual space compression circuit. SFFs 43b, 44b and 45b, which form the final stage of the scan chains 43 to 45, are connected to a test output compression circuit 52b as the virtual space compression circuit.

The number of scan chains, the number of stages of SFFs that form each of the scan chains, the number of test output terminals, and the configuration of the test output compression circuit may be changed or combined in any way.

In this embodiment, the test apparatus 21 carries out the test on the actual LSI 24, and the failure diagnostic apparatus 22 carries out, based on the circuit information 26 on the LSI 24, the construction of the virtual circuit data, the failure simulation, and the failure judgment. However, these operations may be carried out in a single apparatus.

Although this embodiment employs the configuration in which the test pattern 23 is inputted to the test apparatus 21, a configuration in which the LSI includes a circuit that generates a test pattern may be employed. Alternatively, the LSI may include a circuit that compares an output signal with its expectation value and outputs the comparison result.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A failure diagnostic apparatus for failure-diagnosing a semiconductor integrated circuit device, comprising:
   a plurality of scan chains, each of the plurality of scan chains including a plurality of scan flip-flops coupled in series and receiving signals from the semiconductor integrated circuit device; and
   a compression circuit that compresses output signals of the plurality of scan chains to output a first compressed signal,
   wherein a plurality of virtual compression circuits is provided, each of the plurality of virtual compression circuits compressing output signals of scan flip-flops which are provided at a corresponding stage of the plurality of scan chains to output a second compressed signal,
   wherein the second compressed signal is compared with the first compressed signal to failure-diagnose the semiconductor integrated circuit device,
   wherein an assumed failure in the semiconductor integrated circuit device is transmitted via the second compressed signal, and
   the failure diagnostic apparatus carries out failure simulation based on the assumed failure.

2. The failure diagnostic apparatus according to claim 1, wherein the plurality of virtual compression circuits is provided based on circuit information on the semiconductor integrated circuit device.

3. The failure diagnostic apparatus according to claim 1, further comprising:
   an execution portion configured to perform failure simulation on virtual circuit data including the virtual space compression circuit.

4. The failure diagnostic apparatus according to claim 3, further comprising:
   a judgment portion configured to compare the second compressed signal corresponding to the result of the failure simulation with the first compressed signal and to judge whether the assumed failure in the virtual circuit data is true or false.

5. The failure diagnostic apparatus according to claim 1, wherein a plurality of the first compressed signals are outputted, and a plurality of the virtual space compression circuits is set in correspondence to the first compressed signals.

6. The failure diagnostic apparatus according to claim 1, wherein the first compressed signal is a failure log including test output terminal information from which the first compressed signal is outputted and the cycle of failure transmission.

7. The failure diagnostic apparatus according to claim 6, wherein the failure log is assigned to the test output terminal and the cycle, and the assumed failure in the virtual circuit data is judged to be true when the second compressed signal having the transmitted failure coincides with the failure log.

8. A failure diagnostic system comprising:
   a semiconductor integrated circuit device; and
   a failure diagnostic apparatus configured to failure-diagnose a semiconductor integrated circuit device,
   wherein the failure diagnostic apparatus includes:
   a plurality of scan chains, each of the plurality of scan chains including a plurality of scan flip-flops coupled in series and receiving signals from the semiconductor integrated circuit device; and
   a compression circuit that compresses output signals of the plurality of scan chains to output a first compressed signal,
   wherein a plurality of virtual compression circuits is provided, each of the plurality of virtual compression circuits compressing output signals of scan flip-flops which are provided at a corresponding stage of the plurality of scan chains to output a second compressed signal,
   wherein the second compressed signal is compared with the first compressed signal to failure-diagnose the semiconductor integrated circuit device,
   wherein an assumed failure in the semiconductor integrated circuit device is transmitted via the second compressed signal, and
   the failure diagnostic system carries out failure simulation based on the assumed failure.

9. The failure diagnostic system according to claim 8, wherein the plurality of virtual compression circuits is provided based on circuit information on the semiconductor integrated circuit device.

10. The failure diagnostic system according to claim 8, further comprising:
    an execution portion configured to perform failure simulation on virtual circuit data including the virtual space compression circuit.

11. The failure diagnostic system according to claim 8, wherein a plurality of the first compressed signals is outputted, and a plurality of the virtual space compression circuits is set in correspondence to the first compressed signals.

12. The failure diagnostic system according to claim 8, wherein the first compressed signal is a failure log including test output terminal information from which the first compressed signal is outputted and the cycle of failure transmission.

13. The failure diagnostic system according to claim 8, further comprising:
 a test apparatus configured to input a test pattern to the semiconductor integrated circuit device and to compare the output signal of the semiconductor integrated circuit device with an expectation value.

14. A failure diagnostic method comprising:
 inputting signals from a semiconductor integrated circuit device to a plurality of scan chains, each of the plurality of scan chains including a plurality of scan flip-flops connected in series;
 compressing a plurality of signals outputted from the scan chains to generate a first compressed signal;
 compressing output signals of scan flip-flops which are provided at a corresponding stage of the plurality of scan chains to output a second compressed signal; and
 comparing the second compressed signal with the first compressed signal to diagnose the semiconductor integrated circuit device,
 transmitting an assumed failure in the semiconductor integrated circuit device via the second compressed signal, and
 carrying out failure simulation of a semiconductor integrated circuit device based on the assumed failure.

15. The failure diagnostic method according to claim 14, further comprising:
 performing failure simulation on the virtual space compression circuit.

16. The failure diagnostic method according to claim 14, wherein a plurality of the first compressed signals are outputted, and a plurality of the virtual space compression circuits is set in correspondence to the first compressed signals.

17. The failure diagnostic method according to claim 14, wherein the first compressed signal is a failure log including test output terminal information from which the first compressed signal is outputted and the cycle of failure transmission.

18. The failure diagnostic method according to claim 14, further comprising determining a result of the failure simulation based on whether or not a signal is output at a level according to the assumed failure.

* * * * *